United States Patent
Nagai

(10) Patent No.: US 7,475,324 B2
(45) Date of Patent: Jan. 6, 2009

(54) ENCODING APPARATUS FOR STORING DATA TO DISK

(75) Inventor: Hiroki Nagai, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 475 days.

(21) Appl. No.: 11/080,673

(22) Filed: Mar. 16, 2005

(65) Prior Publication Data

US 2005/0210361 A1    Sep. 22, 2005

(30) Foreign Application Priority Data

Mar. 17, 2004    (JP)    ............... 2004-076370

(51) Int. Cl.
*G11C 29/00*    (2006.01)

(52) U.S. Cl. .................... 714/763

(58) Field of Classification Search .......... 714/763, 714/801

See application file for complete search history.

(56) References Cited

U.S. PATENT DOCUMENTS

| | | | | |
|---|---|---|---|---|
| 6,115,323 | A | * | 9/2000 | Hashimoto ............ 365/238.5 |
| 6,167,548 | A | * | 12/2000 | Yamakura ............ 714/763 |
| 2001/0014960 | A1 | * | 8/2001 | Ohyama et al. ......... 714/755 |
| 2004/0163031 | A1 | * | 8/2004 | Moriwaki ............ 714/801 |
| 2007/0011580 | A1 | * | 1/2007 | Noda et al. ............ 714/763 |

FOREIGN PATENT DOCUMENTS

| | | |
|---|---|---|
| JP | 2000-251418 | 9/2000 |
| JP | 2001-298371 | 10/2001 |
| JP | 2003-263844 | 9/2003 |
| JP | 2004-022130 | 1/2004 |

OTHER PUBLICATIONS

Notification of Reasons for Rejection in Japanese Patent Application No. 2004-076370, mailed Jul. 22, 2008 (4 pages).

* cited by examiner

*Primary Examiner*—M. Mujtaba K Chaudry
*Assistant Examiner*—Sam Rizk
(74) *Attorney, Agent, or Firm*—Fish & Richardson P.C.

(57) ABSTRACT

An encoding apparatus which forms sector units of data, to each of which a header and an error detection code are added, from record data to be recorded on an optical disk, arranges a plurality of the sector units of data to form a matrix that is a block unit of data, scrambles the block unit of data exclusive of the headers and error detection codes, appends a first error correction code for each row of the block unit of data, and appends a second error correction code for each column of the block unit of data. The encoding apparatus comprises a generator of the error detection codes; a section that performs the scrambling; a generator of the first error correction codes; a generator of the second error correction codes; and an encoding controller that controls the processes in the above sections to be performed in parallel.

9 Claims, 12 Drawing Sheets

ENCODING APPARATUS FOR STORING DATA TO DISK

CROSS-REFERENCE TO RELATED APPLICATIONS

The present application claims priority upon Japanese Patent Application No. 2004-076370 filed on Mar. 17, 2004, which is herein incorporated by reference.

BACKGROUND OF THE INVENTION

1. Field of the Invention

The present invention relates to an encoding apparatus.

2. Description of the Related Art

In recent years, the use of DVD (Digital Versatile Disk) media of a write-once type, a rewritable type, and the like has been widespread. For the purpose of improving quality of record and playback, the method of recording on a DVD medium is standardized so as to record data produced by performing a scrambling process, an ECC (Error Correcting Code) encoding process, and an 8-to-16 modulation process on data to be recorded (record data). Hereinafter, the series of these processes performed on record data is called an "encoding process", and an apparatus that performs this encoding process is called an "encoding apparatus".

The encoding process for DVDs will be described based on FIGS. 11, 12, 13, and 14.

FIG. 11 is a conceptual view for explaining the data sector of a DVD.

First, record data is divided into data pieces of 2,048 bytes. The data pieces are each called main data, and a header of 12 bytes is added to the head of the main data. This header comprises an ID (Identification Code) of 4 bytes, an ID error detection code (IED) of 2 bytes, and a reserved field of 6 bytes for, e.g., copy protect information (CPM: Copyright Management Code). An EDC (Error Detection Code) of 4 bytes is appended to the main data. This EDC is an error detection code for the main data having the header added thereto.

A total of 2,064 bytes of data having the header and EDC added thereto is handled as a data sector of 172 bytes (columns) by 12 rows with 172 bytes as a unit. Note that a scrambling process using PN (Pseudo-random Noise) sequence addition is performed on the 2,048 byte main data of the data sector by using information indicated by bits 7 through 4 of the ID included in the header as a scramble key.

FIG. 12 is a conceptual view for explaining one ECC block of a DVD.

Sixteen data sectors together form a matrix of 172 bytes by 192 rows (hereinafter, called a data sector group). Inner parities PI (Inner Code Parities) that are each an error correction code for the 172 byte data group of a row, and outer parities PO (Outer Code Parities) that are each an error correction code for the 192 byte data group of a column are generated and appended to this data sector group. Note that the inner parities PI and outer parities PO are generated by performing predetermined processes on the scrambled main data of 2,064 bytes.

The Data having the outer parities PO and inner parities PI appended thereto, which is of 182 bytes (columns) by 208 rows, is called one ECC block, and handled as a unit to perform error correction and error detection and the like. Furthermore, the rows of the one ECC block are rearranged as shown in FIG. 13, wherein the sixteen rows of the outer parities PO are separately disposed at the back of the respective data sectors, to each row of which an inner parity PI is appended. Here, data of 182 bytes by 13 rows wherein inner parities PI of 10 bytes and a row of the outer parities PO are appended to one data sector is handled as a record sector. After the 8-to-16 modulation and NRZI conversion are performed on data of one ECC block made up of 16 record sectors, the data is recorded on a DVD medium.

FIG. 14 is a view of the configuration of a system comprising an encoding apparatus that performs the above encoding process.

An encoding apparatus 810 temporarily writes record data transferred from a host computer 800 into a DRAM (Dynamic Random Access Memory) 820. DRAM 820 is a volatile memory suitable for higher integration such as an SDRAM (Synchronous DRAM), and is usually used as buffer memory for a large amount of record data that a DVD medium handles.

Encoding apparatus 810 performs on record data stored in DRAM 820 the encoding process, i.e., a series of header generation and addition, scrambling, EDC generation and addition, and generation and addition of outer parities PO and inner parities PI, one by one sequentially. See for example Japanese Patent Application Laid-open Publication No. 2004-22130.

Because the scrambling, EDC generation and addition, and generation and addition of outer parities PO and inner parities PI of the encoding process series are sequentially performed in encoding apparatus 810 as shown in FIG. 14, a wait time (process-start wait time) occurs for which another process subsequent to each process of the encoding process series has to wait to start until the process finishes.

Moreover, each process of the encoding process entails access (write/read) to a memory device such as DRAM 820. Hence, by performing sequentially the processes of the encoding process, times (access times) required for access to the memory device such as DRAM 820 involved in the processes accumulate.

As described above, with the conventional scheme for the encoding process, it is difficult to further speed the encoding process because of the process-start wait time and accumulation of memory access times mentioned above.

SUMMARY OF THE INVENTION

The main aspect of the present invention to solve the above problem is an encoding apparatus which, after temporarily writing record data to be recorded on an optical disk into a memory device, forms sector units of data, to each of which a header and an error detection code are added, from the record data, arranges a plurality of the sector units of data to form a matrix that is a block unit of data, scrambles the block unit of data exclusive of the headers and error detection codes, appends a first error correction code for each of first data groups constituting the rows of the block unit of data, and appends a second error correction code for each of second data groups constituting the columns of the block unit of data, the encoding apparatus comprising an error detection code generator that produces the error detection codes; a scrambling section that performs the scrambling; a first error correction code generator that produces the first error correction codes; and a second error correction code generator that produces the second error correction codes, and further comprising an encoding controller that controls at least some of the processes in the error detection code generator, the scrambling section, the first error correction code generator, and the second error correction code generator to be performed in parallel.

According to the present invention, there is provided an encoding apparatus and method to speed up the encoding process associated with recording on an optical disk.

Features and objects of the present invention other than the above will become clear by reading the description of the present specification with reference to the accompanying drawings.

BRIEF DESCRIPTION OF THE DRAWINGS

For a more complete understanding of the present invention and the advantages thereof, reference is now made to the following description taken in conjunction with the accompanying drawings wherein.

DETAILED DESCRIPTION OF THE INVENTION

At least the following matters will be made clear by the explanation in the present specification and the description of the accompanying drawings.

<System Configuration>

Figure 1:
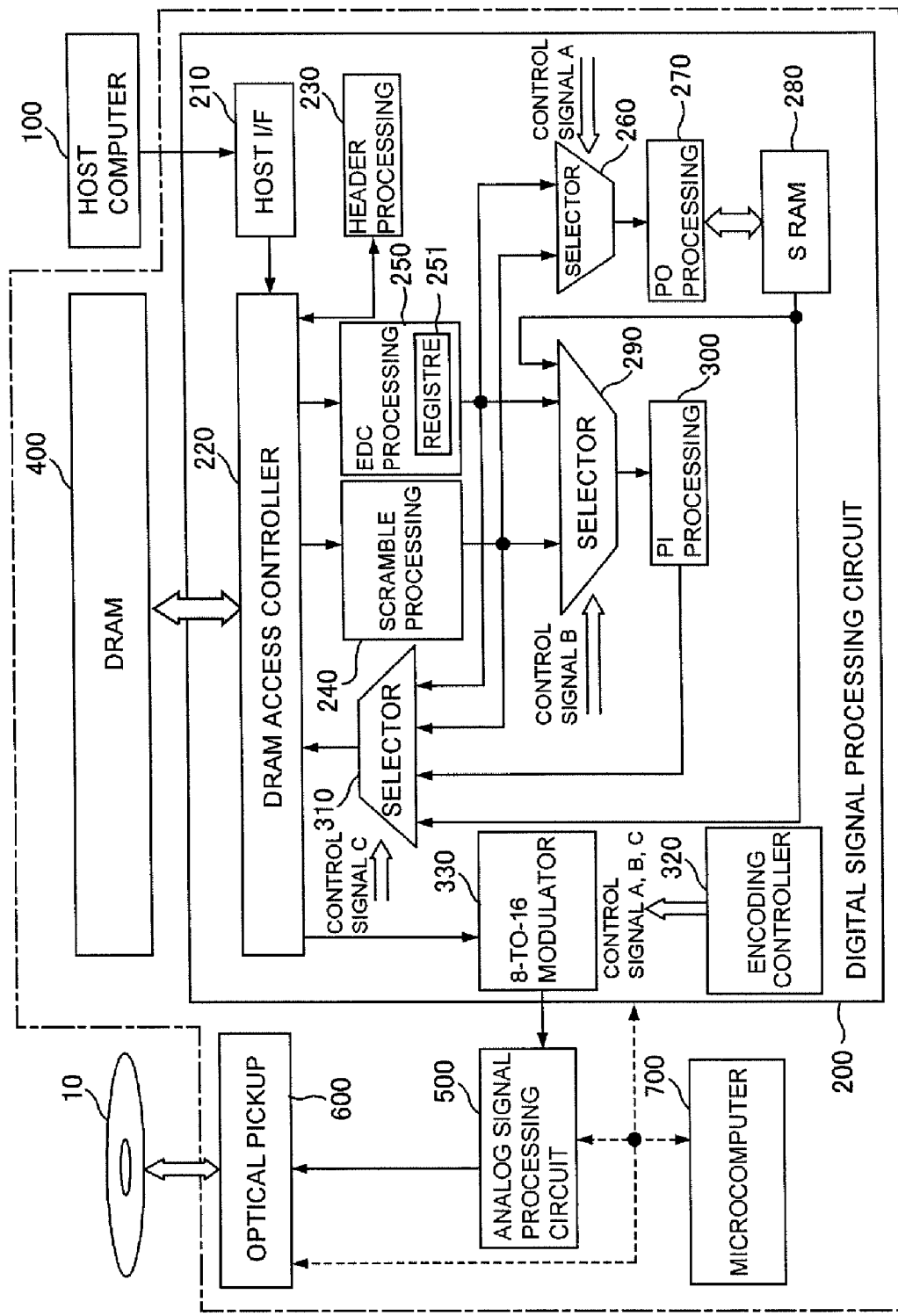
FIG. 1 is a view for explaining the entire configuration of an optical disk system according to an embodiment of the present invention.

FIG. 1 is the entire configuration diagram of an optical disk system comprising an encoding apparatus according to an embodiment of the present invention. Note that in the present embodiment, target optical disks are recordable DVD media of the write-once type or rewritable type.

The optical disk system mainly comprises a host computer 100, a digital signal processing circuit 200, a DRAM 400, an analog signal processing circuit 500, an optical pickup 600, and a microcomputer 700.

The host computer 100 is a personal computer having optical disk storage apparatus (enclosed by the dot-dashed line) provided thereto, and transfers record data to be recorded on an optical disk 10 (such as video, image, voice data) to the digital signal processing circuit 200.

The digital signal processing circuit 200 is embodied as, e.g., a chip of a DSP (Digital Signal Processor) including a digital servo section that digitally controls tracking servo, focus servo, and the like, and a DVD signal processing section that performs digital DVD signal processing such as encoding and decoding. Here, the encoding apparatus according to the present embodiment is embodied as a function of the DVD signal processing section of the digital signal processing circuit 200.

Accordingly, a description below of the digital signal processing circuit 200 will be centered on the encoding apparatus according to the present embodiment. Needless to say, the digital servo section and the DVD signal processing section may be embodied as separate chips, and further, the encoding and decoding subsections of the DVD signal processing section may be embodied as separate chips, that is, the encoding apparatus according to the embodiment may be embodied as one separate chip.

Digital signal processing circuit 200 (the encoding apparatus) temporarily writes record data transferred from host computer 100 into DRAM 400, and performs predetermined digital signal processing such as DVD encoding on the record data stored in DRAM 400. Although in the present embodiment, DRAM 400 is an SDRAM suitable for higher integration and larger storage capacity, instead DRAM 400 may be volatile memory such as an SRAM or nonvolatile memory such as flash memory or EEPROM.

Analog signal processing circuit 500 performs predetermined analog signal processing such as drive control of a semiconductor laser (not shown) in optical pickup 600 on record data on which digital signal processing circuit 200 has performed the predetermined digital signal processing. Note that analog signal processing circuit 500 and digital signal processing circuit 200 may be integrated in one chip.

Optical pickup 600 comprises a semiconductor laser, an optical detector, an optical lens, a for-servo actuator, and the like (none of which are shown), and controls the driving of the semiconductor laser, among other things, according to the record data on which analog signal processing circuit 500 has performed the predetermined analog signal processing to emit laser light for recording on optical disk 10.

Microcomputer 700 controls the entire optical disk storage apparatus including digital signal processing circuit 200, analog signal processing circuit 500, optical pickup 600, and the like.

<Address Space of the DRAM>

Figure 2:
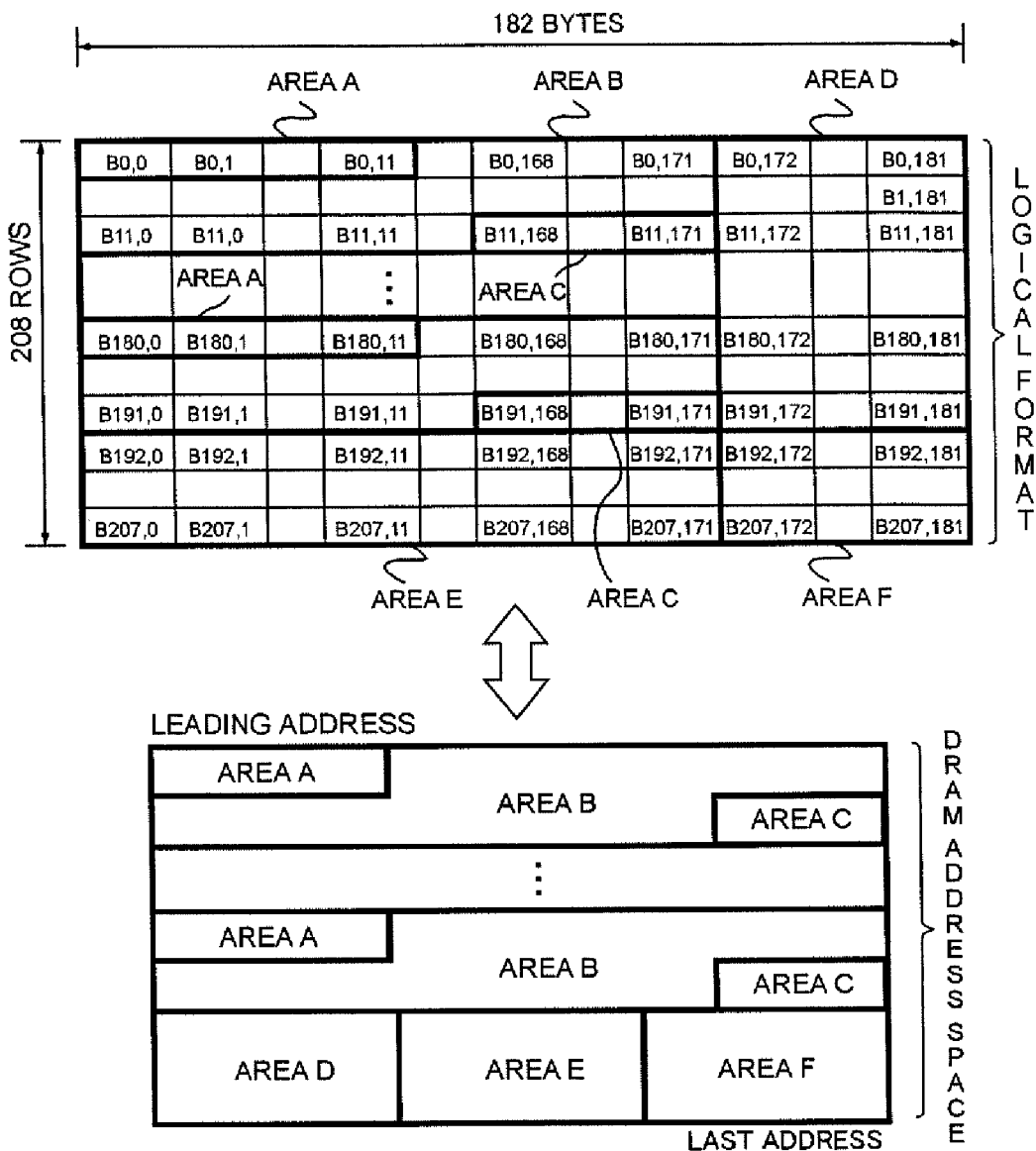
FIG. 2 is a view for explaining correspondence between the logical format of an optical disk and the address space of a DRAM.

FIG. 2 is a view for explaining the correspondence between data of one ECC block (before the rows are rearranged) defined in a DVD logical format and the address space of one ECC block in DRAM 400 (hereinafter, called a DRAM address space). Hereinafter, the data of one ECC block is expressed in a data unit of 1 byte, "Bi,j where i, j=natural numbers" called a "symbol", hereinafter.

In one ECC block, each symbol group of 12 rows by 172 columns constitutes one data sector. A symbol group Bi,j where i=0 to 191 and j=0 to 171 that is a matrix of 192(=12× 16) rows by 172 columns, formed by 16 of such data sectors together is a data sector group to perform error correction using inner parities PI and outer parities PO on.

Of each data sector, the first 12 bytes, symbols Bi,j where i=12×n (n=one of 0 to 15) and j=0 to 11, form a header (ID, IED, and CPM) for the data sector. This header is stored in an area A (first memory area) in the DRAM address space. In the area A, the symbols forming the header of 12 bytes are each assigned a row address indicating the leading row of the corresponding data sector and a column address according to the symbol's position in the column order.

Of each data sector, symbols other than the first 12 bytes and last 4 bytes form 2,048 bytes of main data. These 2,048 bytes are stored in an area B in the DRAM address space. In the area B the symbols forming the 2,048 bytes of main data are each assigned a row address and a column address according to the symbol's position in the row-column order.

Of each data sector, the last 4 bytes, $B_{i,j}$ where $i=12\times n-1$ ($n$=one of 1 to 16) and $j=168$ to 171, form an EDC appended to the data sector. The EDC is stored in an area C in the DRAM address space. In the area C, symbols forming the EDC of 4 bytes are each assigned a row address indicating the last row of the corresponding data sector and a column address according to the symbol's position in the column order.

Of each data sector, an inner parity PI of 10 bytes, $B_{i,j}$ where $i$=one of 0 to 191 and $j=172$ to 181, is appended to the symbols of each row. And an outer parity PO of 16 bytes, $B_{i,j}$ where $i$=one of 192 to 207 and $j=0$ to 171, is appended to the symbols of each column. These inner parities PI and outer parities PO are stored in an area D (second memory area) and an area E in the DRAM address space, respectively.

Furthermore, an inner parity PI, $B_{i,j}$ where $i$=one of 192 to 207 and $j=172$ to 181, is appended to each of the rows of the outer parities PO, symbols $B_{i,j}$ where $i=192$ to 207 and $j=0$ to 171. These inner parities PI are stored in an area F in the DRAM address space. The $B_{i,j}$ where $i=192$ to 207 and $j=172$ to 181 may be outer parities PO for the inner parities PI, $B_{i,j}$ where $i=0$ to 191 and $j=172$ to 181.

As described above, in the order in which the headers, scrambled data, EDCs, inner parities PI, and outer parities PO are generated, one ECC block of the DRAM address space is partitioned into areas A to F. Thus, DRAM 400 can be efficiently accessed in writing the results of carrying out a parallelized encoding process into DRAM 400 as described later.

Note that when writing/reading on a per symbol basis into/from DRAM 400, the row address and column address corresponding to each symbol are specified, and that when writing/reading on a per row of ECC block basis into/from DRAM 400, after the row address is specified, the column address is updated sequentially and after the writing into or reading from the specified row finishes, the writing/reading proceeds to the next row.

First Embodiment

<Digital Signal Processing Circuit (Encoding Apparatus)>

A description is made of the detailed configuration of digital signal processing circuit 200 (controller) shown in FIG. 1, that is, an encoding apparatus according to the present embodiment.

A host interface (host I/F) 210 is an interface that controls sending/receiving data to/from host computer 100. Host I/F 210 transfers record data transferred from host computer 100 to the optical disk apparatus (enclosed by the dot-dashed line) in the encoding process to a DRAM access controller 220. As a result, the record data transferred from host computer 100 is divided into units of 2,048 bytes (main data) and temporarily written into DRAM 400. Host I/F 210 is, for example, ATAPI (Advanced Technology Attachment Packet Interface).

DRAM access controller 220 controls writing/reading data into/from DRAM 400. Data is written to and read from DRAM 400 on a per row of ECC block basis or on a per symbol basis on the basis of access control signals generated in an encoding controller 320.

A header processing section 230 generates a header of 4 bytes to be added to each data sector. DRAM access controller 220 writes the generated header into DRAM 400.

A scramble processing section 240 performs sequentially on main data, read out by DRAM access controller 220 from DRAM 400, the PN sequence addition that is a scrambling process using information indicated by bits 7 through 4 of the ID, included in the header read out along with the main data, as a scramble key. The scrambled main data is supplied to selectors 260, 290, 310 simultaneously.

In parallel with the scrambling, an EDC processing section 250 performs an operation for generating the EDC of 4 bytes (hereinafter, called an EDC process) sequentially on the main data and header read out by DRAM access controller 220 from DRAM 400, and stores data intermediate in the EDC process (hereinafter, called EDC intermediate data) in a register 251 and supplies the data to selectors 260, 290, 310 simultaneously. Note that the EDC may be such as parity bits or CRC (Cyclic Redundancy Code).

A selector 260 (a first selector) selects either the scrambled main data or the EDC intermediate data on the basis of a control signal A supplied at a predetermined selection timing from encoding controller 320.

A PO processing section 270 (a second-error-correction-code generator) performs an operation for generating outer parities PO (second error correction code) on data selected in selector 260, the operation being called a PO process (second operation) hereinafter. The outer parities PO may be Reed-Solomon code.

Because main data is read out from DRAM 400 on a per row of data sector group basis, outer parities PO for the columns of a data sector group are not completely calculated until the last row of main data of the last data sector is read out. Accordingly, an SRAM 280 is provided as a memory device for storing data intermediate in the calculation of the outer parities PO (hereinafter, called PO intermediate data).

Figure 3:
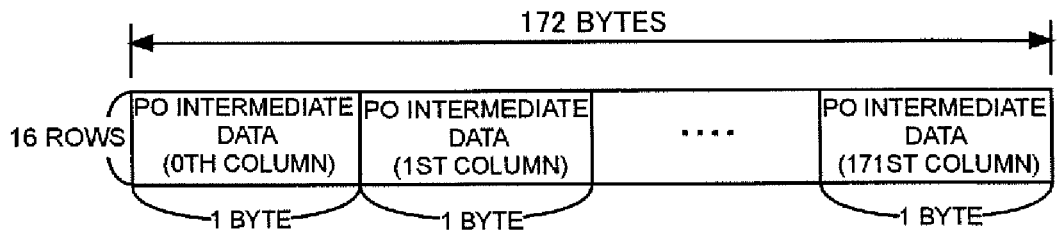
FIG. 3 is a view for explaining the address space of an SRAM for a PO process.

As shown in FIG. 3, SRAM 280 needs to have a storage capacity equal to 16 rows by 172 bytes in order to store respective PO intermediate data for the columns 0 to 171 of a data sector group. Note that PO intermediate data is stored in SRAM 280 and supplied to selectors 290, 310 simultaneously.

A selector 290 (a second selector) selects either the scrambled main data, or the EDC intermediate data, or the PO intermediate data on the basis of a control signal B supplied at a predetermined selection timing from encoding controller 320.

A PI processing section 300 (a first-error-correction-code generator) performs an operation for generating inner parities PI (first error correction code) on data selected in selector 290, the operation being called a PI process (first operation) hereinafter. The inner parities PI may be Reed-Solomon code.

A selector 310 (a third selector) selects one of the scrambled main data, the EDC intermediate data, the PO intermediate data, and the inner parities PI on the basis of a control signal C supplied at a predetermined selection timing from encoding controller 320.

Encoding controller 320 controls the entire encoding process of digital signal processing circuit 200, and generates at appropriate timings memory access control signals such as address data and command data to be supplied to DRAM access controller 220 and the control signals A, B, C to be supplied to selectors 260, 290, 310. As a result, the main data of a data sector group is sequentially read out from DRAM 400. And selector 310 sequentially selects sequentially from the results of the scrambling, the EDC process, the PI process, and the PO process, which are performed in parallel, and writes back to DRAM 400. Thereby, one ECC block of data is configured in DRAM 400.

An 8-to-16 modulator 330 performs interleaving, 8-to-16 modulation, NRZI modulation on the one ECC block of data configured in DRAM 400. Then, the data processed by 8-to-16 modulator 330 is transferred to analog signal processing circuit 500.

<Flow of the Encoding Process>

Outline

Figure 4:
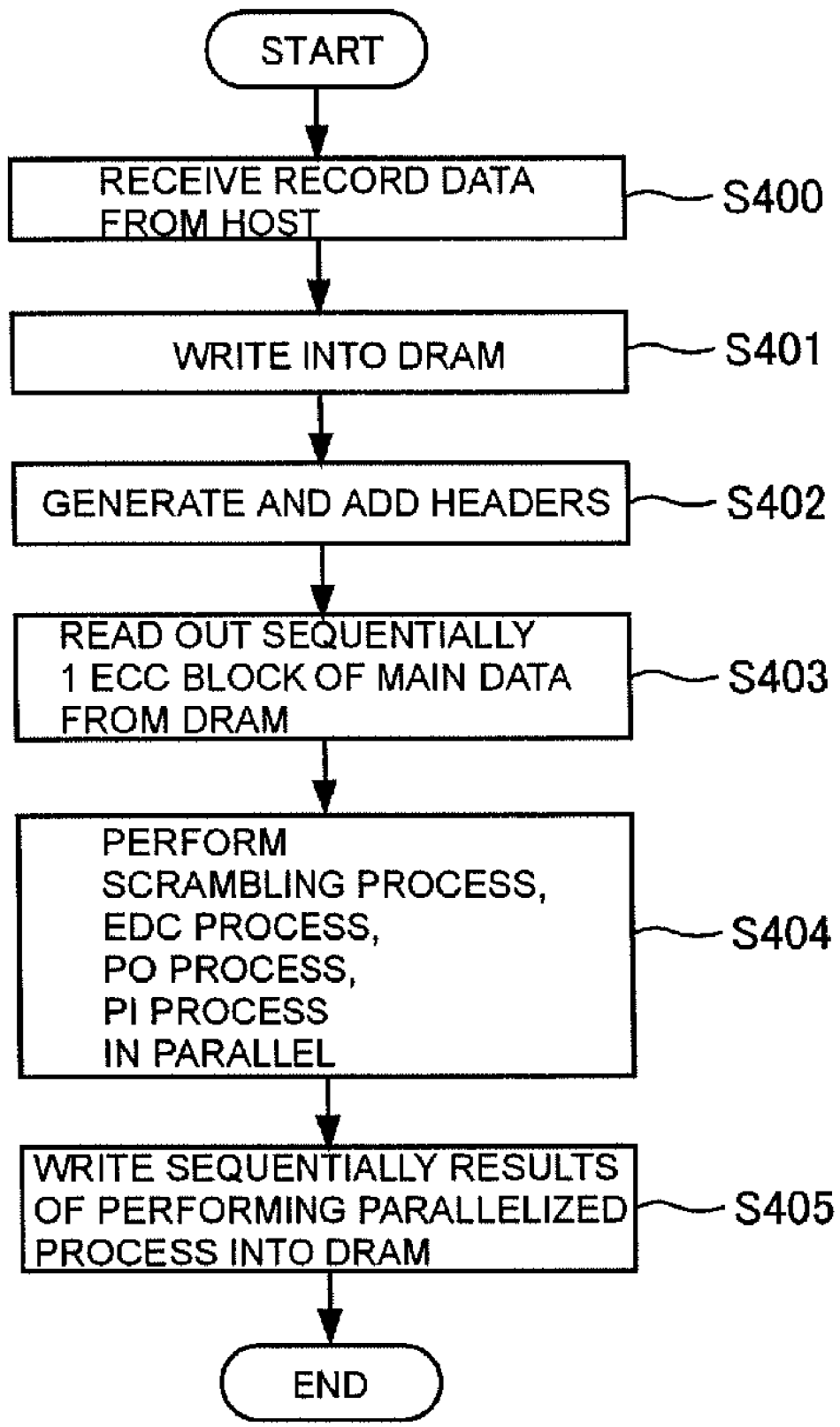
FIG. 4 is a flow chart for explaining the process in an encoding apparatus according to the embodiment of the present invention.

FIG. 4 is a flow chart for explaining the flow of the encoding process according to the present invention. In the description below, digital signal processing circuit 200 controls the operation unless otherwise stated.

First, digital signal processing circuit 200 receives record data transferred from host computer 100 via host I/F 210 (S400). This record data is divided into units of 2,048 bytes (main data) and temporarily written by DRAM access controller 220 into DRAM 400 (S401). Then, header processing section 230 generates a header of 4 bytes to be added to each data sector, and DRAM access controller 220 writes the generated header into DRAM 400 (S402).

DRAM access controller 220 reads out the main data of the data sector group from DRAM 400 for each row of the ECC block, more specifically on a per symbol basis (S403). Each of the read-out main data is supplied to scramble processing section 240 and EDC processing section 250, and the main data scrambled and EDC processed is supplied to PO processing section 270 and PI processing section 300. As a result, the scrambling, the EDC process, the PO process, and the PI process are performed in parallel as a parallelized process (S404). The results of the parallelized process are sequentially written into DRAM 400 via selector 310 and DRAM access controller 220 (S405).

When performing the encoding process for forming one ECC block on the main data written in DRAM 400, the encoding apparatus according to the present invention performs the scrambling, the EDC process, the PO process, and the PI process in parallel, and hence, the main data written in DRAM 400 needs to be read out only once. As a result, compared with the conventional art, the number of times a memory device such as DRAM 400 is accessed can be reduced and thus, the encoding process can be speeded up.

Process of the I'th Row

Figure 5:
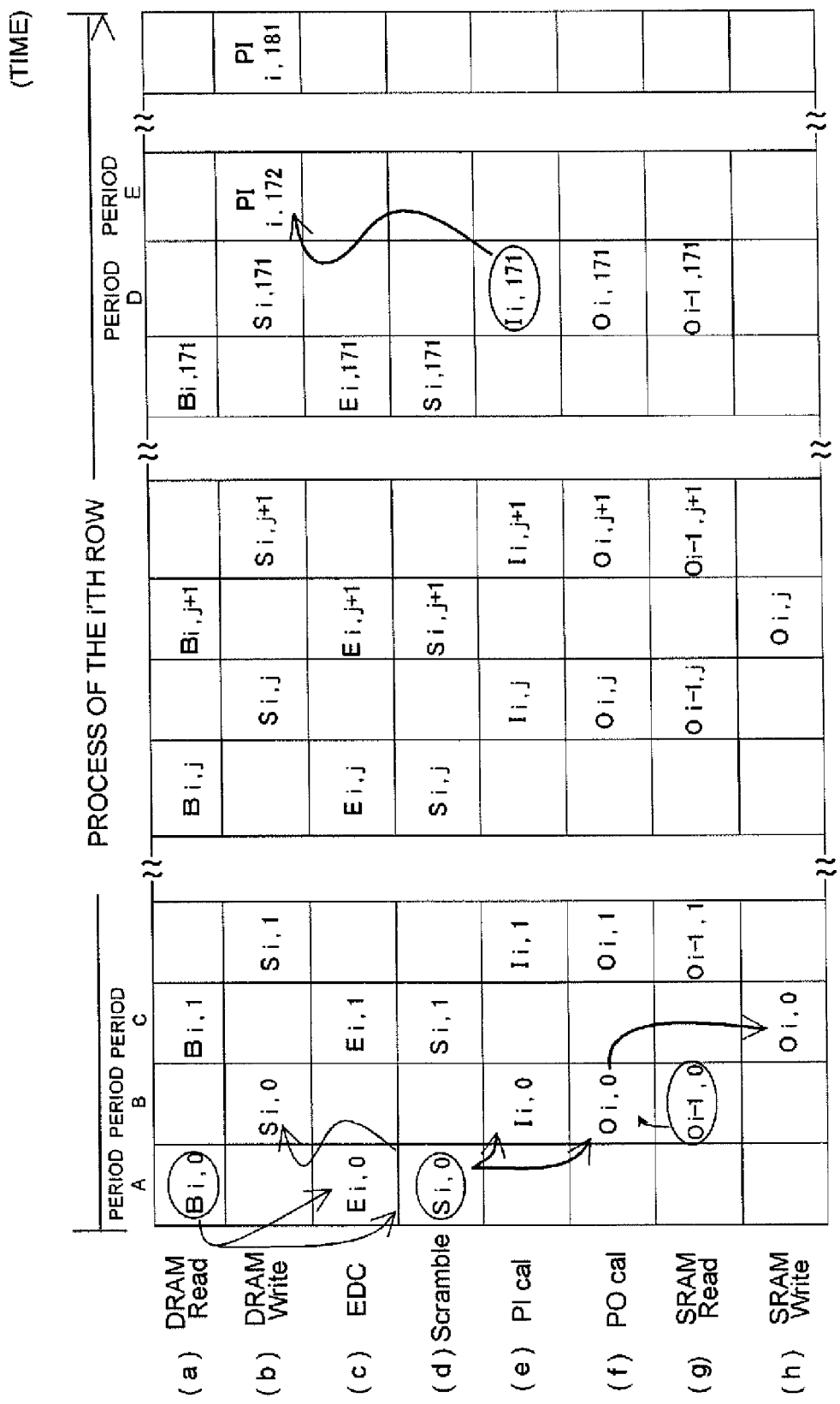
FIG. 5 is a view for explaining the process in the encoding apparatus according to the embodiment of the present invention.

FIG. 5 is a view for explaining the flow of the encoding process on a per symbol basis for a symbol group Bi,j where j=0 to 171, constituting the i'th row of one ECC block.

First, in time period A of FIG. 5, a symbol Bi,0 corresponding to the 0th column and the i'th row of one ECC block is read out from DRAM 400, and the read-out symbol Bi,0 is supplied to scramble processing section 240 and EDC processing section 250. As a result, in scramble processing section 240, scrambled data Si,0 is produced by scrambling symbol Bi,0, and in EDC processing section 250, EDC intermediate data Ei,0 is produced based on symbol Bi,0.

Then, in time period B of FIG. 5, scrambled data Si,0 is selected by selector 310, and written into DRAM 400. In parallel with the writing into DRAM 400, scrambled data Si,0 is supplied to PO processing section 270 via selector 260 and PI processing section 300 via selector 290. Further, PO processing section 270 reads out PO intermediate data Oi-1,0 from SRAM 280 that has been calculated in the PO process up to the i−1'th row, and then produces PO intermediate data Oi,0 based on scrambled data Si,0 and PO intermediate data Oi-1,0. At the same time, PI processing section 300 produces PI intermediate data Ii,0 based on scrambled data Si,0.

Then, in time period C of FIG. 5, PO intermediate data Oi,0 calculated in the PO process up to the i'th row is stored into SRAM 280. In parallel with the storing into SRAM 280, a symbol Bi,1 corresponding to the 1st column and the i'th row is read out from DRAM 400, and the encoding process is repeated.

It is assumed that in time period D of FIG. 5, the encoding process finishes for symbols Bi,j where j=0 to 171, in the i'th row and up to the 171st column. In this case, PI intermediate data Ii,171 is the final inner parity of 10 bytes, PIi,j where j=172 to 181, for the i'th row. Thus, in time period E and later in FIG. 5, the inner parity, PIi,j where j=172 to 181, is written into DRAM 400 on a per byte basis.

Process of the (12×n−1)th Row (n=1 to 16)=

Figure 6:
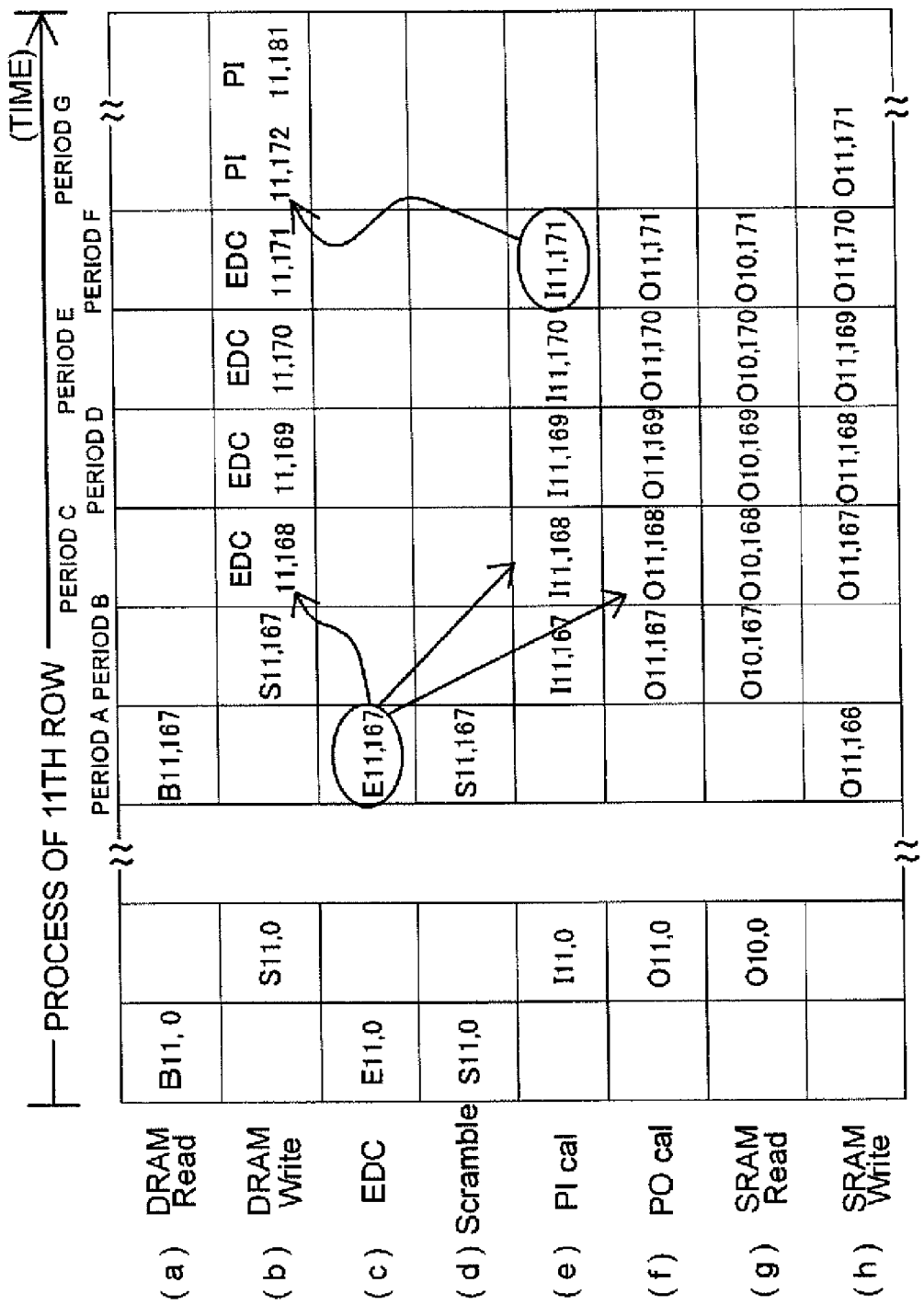
FIG. 6 is a view for explaining the process in the encoding apparatus according to the embodiment of the present invention.

FIG. 6 is a view for explaining the flow of the encoding process on a per symbol basis for a symbol group B11,j where j=0 to 171, constituting the 11th row of one ECC block. In the encoding process for the 11th row, EDC is written into DRAM 400.

First, in time period A of FIG. 6, based on a symbol B11,167 corresponding to the 167th column and the 11th row of one ECC block, scrambled data S11,167 and EDC intermediate data E11,167 are produced. Then, in time period B of FIG. 6, scrambled data S11,167 is written into DRAM 400. At the same time,. PO intermediate data O11,167 and PI intermediate data I11,167 are produced.

Here, EDC intermediate data E11,167 is the final 4 bytes of EDC11,j where j=168 to 171, appended to the first data sector. Thus, in time periods C to F of FIG. 6, EDC11,j where j=168 to 171, are written into DRAM 400 on a per byte basis.

Moreover, in time periods C to F of FIG. 6, in parallel with the writing of EDC11,j where j=168 to 171 into DRAM 400, PO intermediate data O11,j where j=168 to 171 and PI intermediate data I11,j where j=168 to 171 are sequentially produced.

Here, PI intermediate data I11,171 produced in time period F of FIG. 6 is the final inner parity of 10 bytes, PI11,j where j=172 to 181, for the 11th row. Thus, in time period G and later in FIG. 6, the inner parity, PI11,j where j=172 to 181, is written into DRAM 400 on a per byte basis.

Process of the 192nd to the 207th Row

Figure 7:
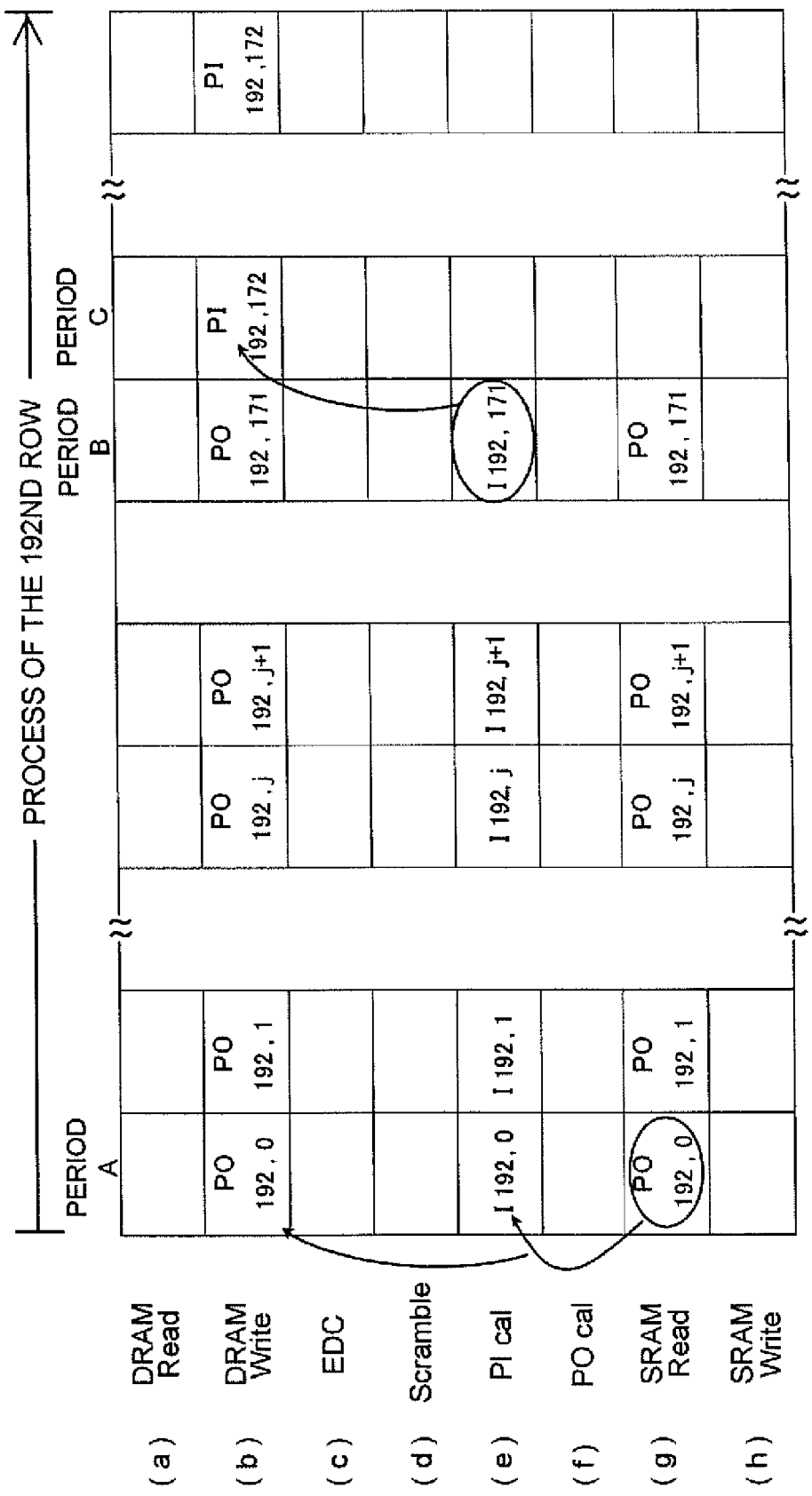
FIG. 7 is a view for explaining the process in the encoding apparatus according to the embodiment of the present invention.

FIG. 7 is a view for explaining the flow of the encoding process on a per symbol basis for a symbol group B192,j where j=0 to 171, constituting the 192nd row of one ECC block. In the encoding process for the 192nd row, error correction code, an inner parity PI, is produced for outer parities PO, that is, a symbol group B192,j where j=0 to 171.

In the encoding process up to the 191st row, the final outer parities PO of 16 rows by 172 bytes, POi,j where i=192 to 207 and j=0 to 171, are calculated and stored into SRAM 280.

Here, in time period A of FIG. 7, outer parity PO192,0 is read out from SRAM 280. Then, the outer parity PO192,0 read out is written into DRAM 400 via selector 310.

In parallel with the writing of the outer parity PO192,0 into DRAM 400, the outer parity PO192,0 is supplied to PI processing section 300 via selector 290. As a result, PI processing section 300 produces PI intermediate data I192,0 based on the outer parity PO192,0. This process for producing PI intermediate data is repeated for each byte of PO192,j where j=0 to 171, sequentially. Thus, in time period B of FIG. 7, PI intermediate data I192,171 is produced for the 171st column and 192nd row.

The PI intermediate data I192,171 is the final inner parity of 10 bytes, PI192,j where j=172 to 181, for the 192nd row. Thus, in time period C and later in FIG. 7, the inner parity, PI192,j where j=172 to 181, is written into DRAM 400 on a per byte basis.

In the above process, error correction code, inner parities PIi,j where i=192 to 207 and j=172 to 181, are produced for and from the outer parities POi,j where i=192 to 207 and j=0 to 171, written in SRAM 280. Thus, PI processing section 300 for the PI processing of each row of the data sector group can also be used for the PI processing of the outer parities PO. Thus, the circuit scale of digital signal processing circuit 200 can be prevented from enlarging.

Needless to say, the symbol group Bi,j where i=192 to 207 and j=172 to 181 may be error correction code for the inner parities PIi,j where i=0 to 191 and j=172 to 181, appended to the rows of the data sector group. In this case, the error correction code is outer parities PO because of the restriction of the Reed-Solomon code.

Furthermore, the scheme for producing these outer parities PO can be realized by changing part of the configuration shown in FIG. 1 as follows. For example, SRAM 280 and the scheme for supplying PO intermediate data from SRAM 280 to selector 290 are not needed. Further, appropriate memory means (SRAM, etc.) for storing PI intermediate data produced in PI processing section 300 is newly provided and PI intermediate data stored in the memory means is supplied to selector 260.

By this change, after the inner parities PI for the respective rows of the data sector group are produced, the inner parities PI produced are stored in the memory means. Then, selector 260 selects the inner parities PI stored in the memory means, and thus, PO processing section 270 produces outer parities PO for the selected inner parities PI. Hence, PO processing section 270 provided for the PO processing of each column of the data sector group can also be used for the PO processing of the inner parities PI. Thus, the circuit scale of digital signal processing circuit 200 can be prevented from enlarging.

Second Embodiment

<Digital Signal Processing Circuit (Encoding Apparatus)>

Figure 8:
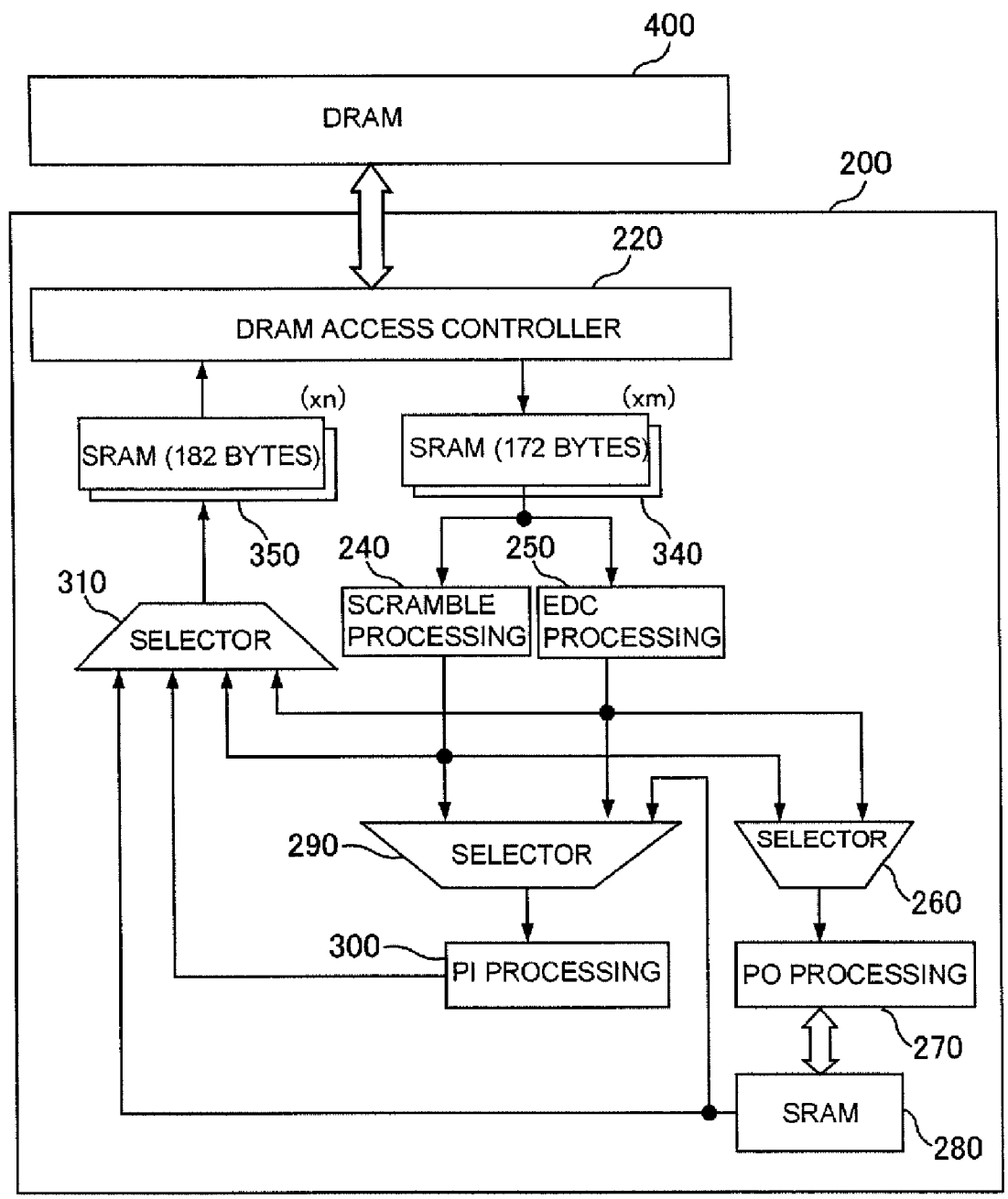
FIG. 8 is a view for explaining the configuration of an encoding apparatus according to another embodiment of the present invention.

FIG. 8 is a view showing digital signal processing circuit 200 (a controller) that is another embodiment of the encoding apparatus according to the present invention.

The difference in configuration from the embodiment shown in FIG. 1 is that a plurality (m) of SRAMs 340 are provided between DRAM access controller 220, and scramble processing section 240 and EDC processing section 250 and that a plurality (n) of SRAMs 350 are provided between selector 310 and DRAM access controller 220.

SRAMs 340 are buffer memory devices for temporarily storing a predetermined data size of main data read out from DRAM 400. Although the buffer memory devices can be memory devices other than SRAMS, the use of SRAMs, which do not need the refresh operation as opposed to DRAM 400 and have shorter access times, is suitable for speeding up the encoding process according to the present invention.

Note that the memory capacity of SRAM 340 is set equal to the predetermined data size. The predetermined data size is preferably the size of a data group constituting a row of a data sector group, i.e., 172 bytes since usually writing into and reading from DRAM 400 on a per row of data sector group basis. Note that not being limited to the 172 bytes, the memory capacity of SRAM 340 may be 172 bytes times k, the data size of data forming a plurality (k) of rows of a data sector group.

SRAMs 350 are buffer memory devices for temporarily storing results of performing the encoding process on a predetermined data size of main data read out from DRAM 400. Although the buffer memory devices can be memory devices other than SRAMs, SRAMs are preferably used for the same reason as for SRAMs 340.

Note that the memory capacity of SRAM 350 is set equal to the predetermined data size. The predetermined data size is preferably the size of a data group constituting a row of a data sector group, i.e., 172 bytes plus the 10 bytes of the inner parity PI which total 182 bytes since usually writing into and reading from DRAM 400 on a per row of data sector group basis. Note that not being limited to the 182 bytes, the memory capacity of SRAM 340 may be 182 bytes times 1, which equal 172 bytes times 1, the data size of data forming a plurality (1) of rows of a data sector group, plus the 10 bytes times 1 of inner parities PI.

<Flow of the Encoding Process>

SRAMs on the Reading-Out Side

Figure 9:
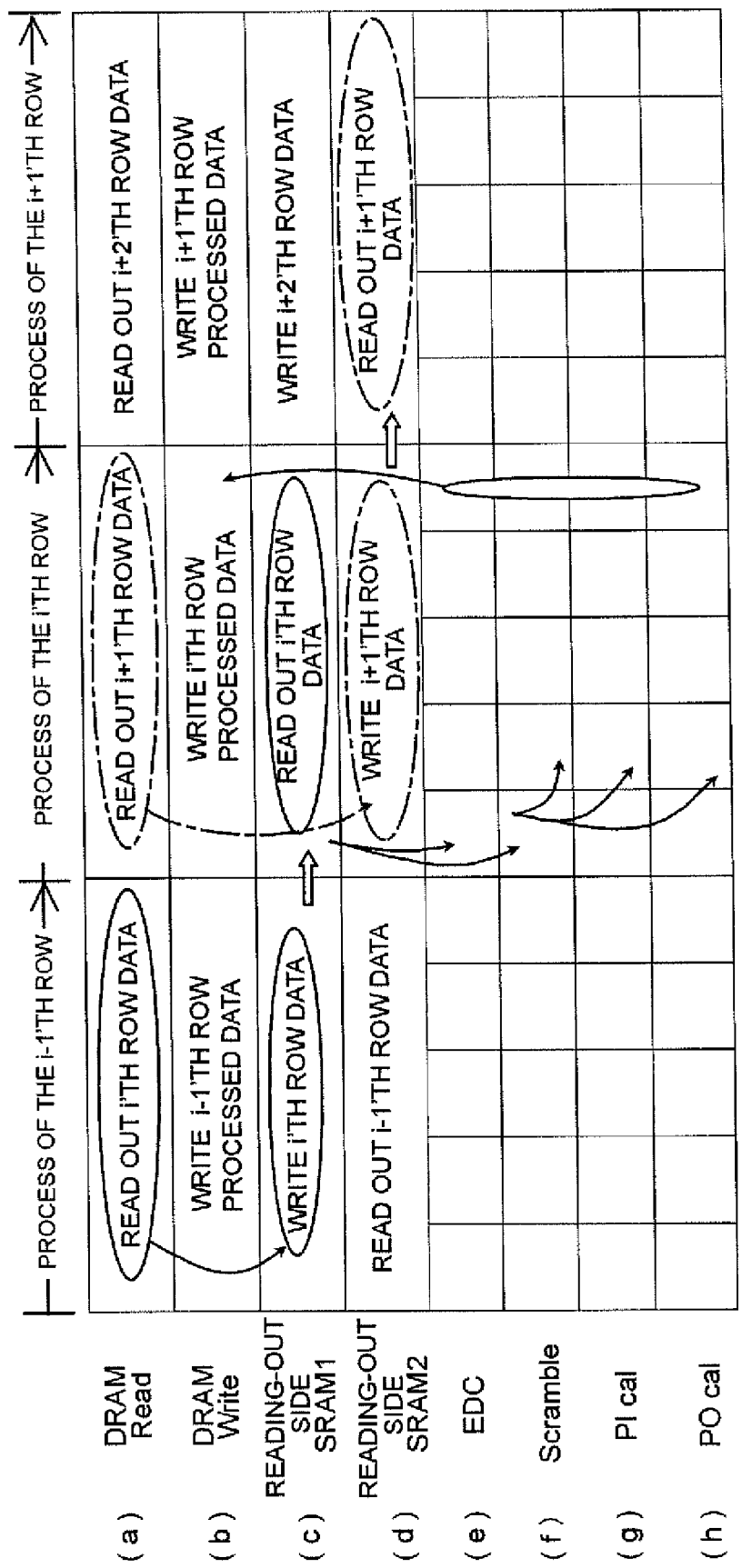
FIG. 9 is a view for explaining the process in the encoding apparatus according to the other embodiment of the present invention.

The flow of the encoding process using SRAMs 340 will be described based on FIG. 9. In the process example of FIG. 9, two SRAMs 340 are provided, but without an SRAM 350.

Hereinafter, the time period when the encoding process is performed on the i'th row (i=0 to 191) of a data sector group is called the i'th cycle; a data group constituting the i'th row of the data sector group is called the i'th row data, and the results of performing the encoding process on the i'th data are called the i'th row processed data. Unless otherwise stated, digital signal processing circuit 200 controls the operation.

First, in the i−1'th cycle, the i'th row data to be used in the next i'th cycle is read out from DRAM 400 and stored sequentially into one SRAM 340.

Then, in the i'th cycle, the i'th row data stored in the one SRAM 340 is transferred to scramble processing section 240 and EDC processing section 250. As a result, the scramble process, EDC process, PI process, and PO process are simultaneously performed. As a result of the parallelized process, the i'th row processed data is written sequentially into DRAM 400.

In the i'th cycle, in parallel with the transfer of the i'th row data from the one SRAM 340 to scramble processing section 240 and EDC processing section 250, the i+1'th row data to be used in the next i+1'th cycle is read out from DRAM 400 and stored sequentially into the other SRAM 340. And in the i+1'th cycle and later, the above process is repeated until the encoding process for the 191st row of the data sector group finishes.

As described above, by providing a plurality of SRAMs 340, in parallel with the encoding process for data of any row of the data sector group, data of the next row of the data sector group is read out from DRAM 400. Hence, without waiting for data to be read out from DRAM 400, the scramble process, EDC process, PO process, and PI process of the encoding process can start to be performed. Thus, the encoding process can be further speeded up.

SRAMs on the Writing-In Side

Figure 10:
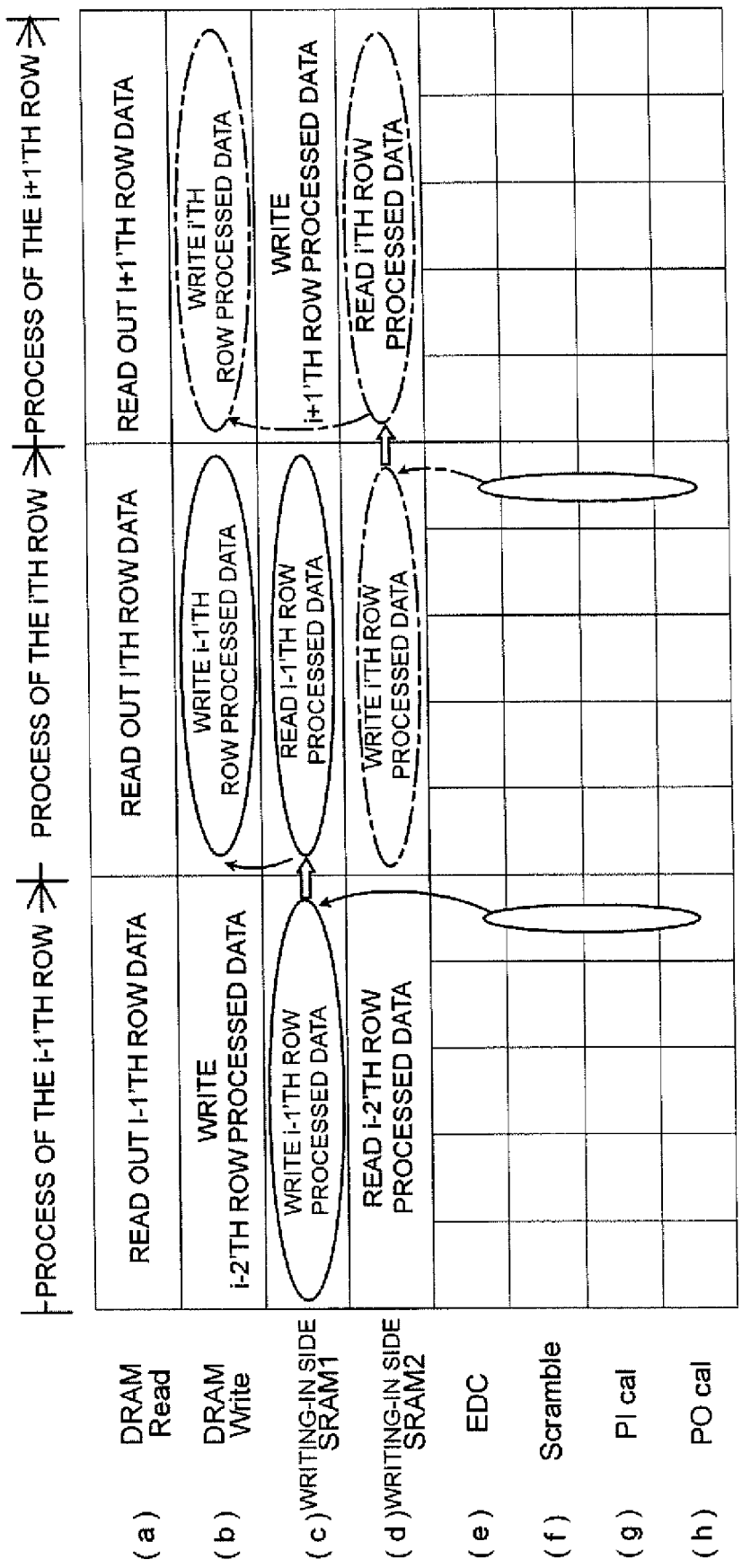
FIG. 10 is a view for explaining the process in the encoding apparatus according to the other embodiment of the present invention.
Figure 11:
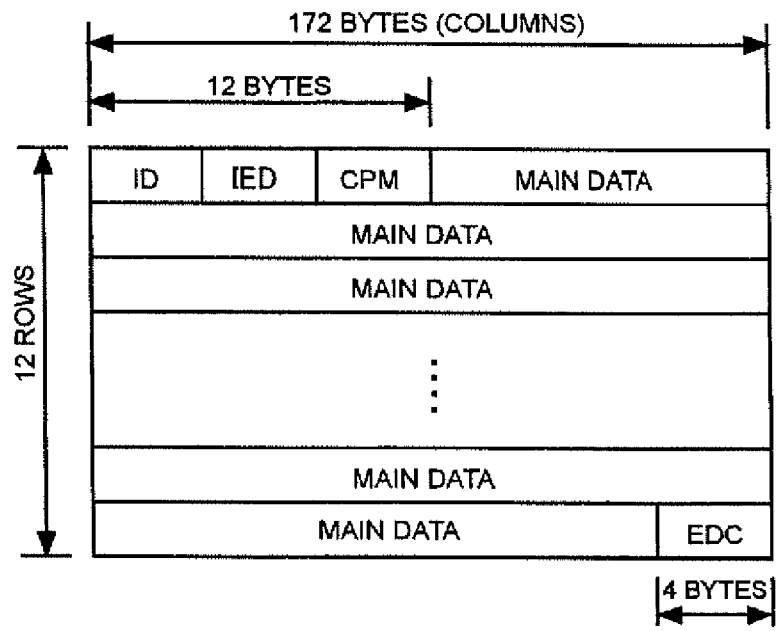
FIG. 11 is a view for explaining a data sector of a DVD.
Figure 12:
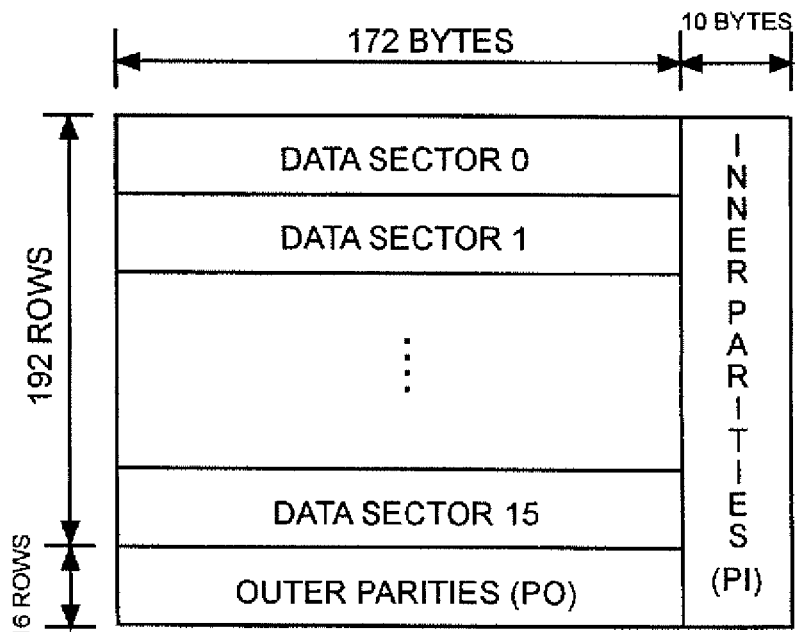
FIG. 12 is a view for explaining an ECC block of the DVD.
Figure 13:
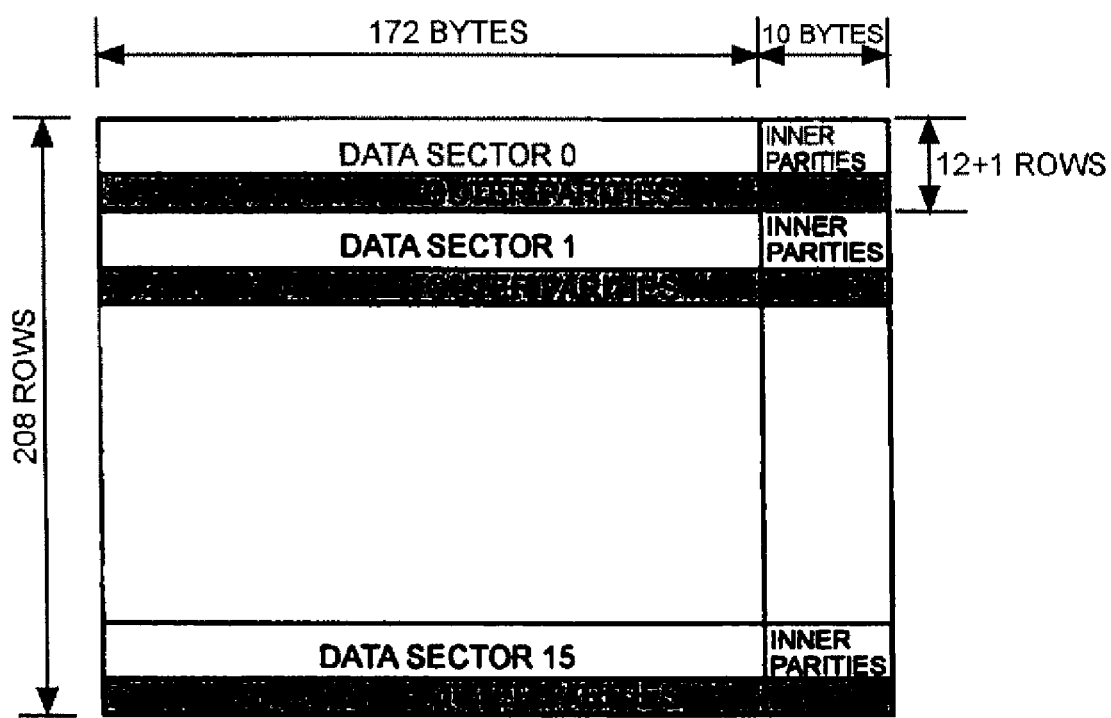
FIG. 13 is a view for explaining record sectors of the DVD.
Figure 14:
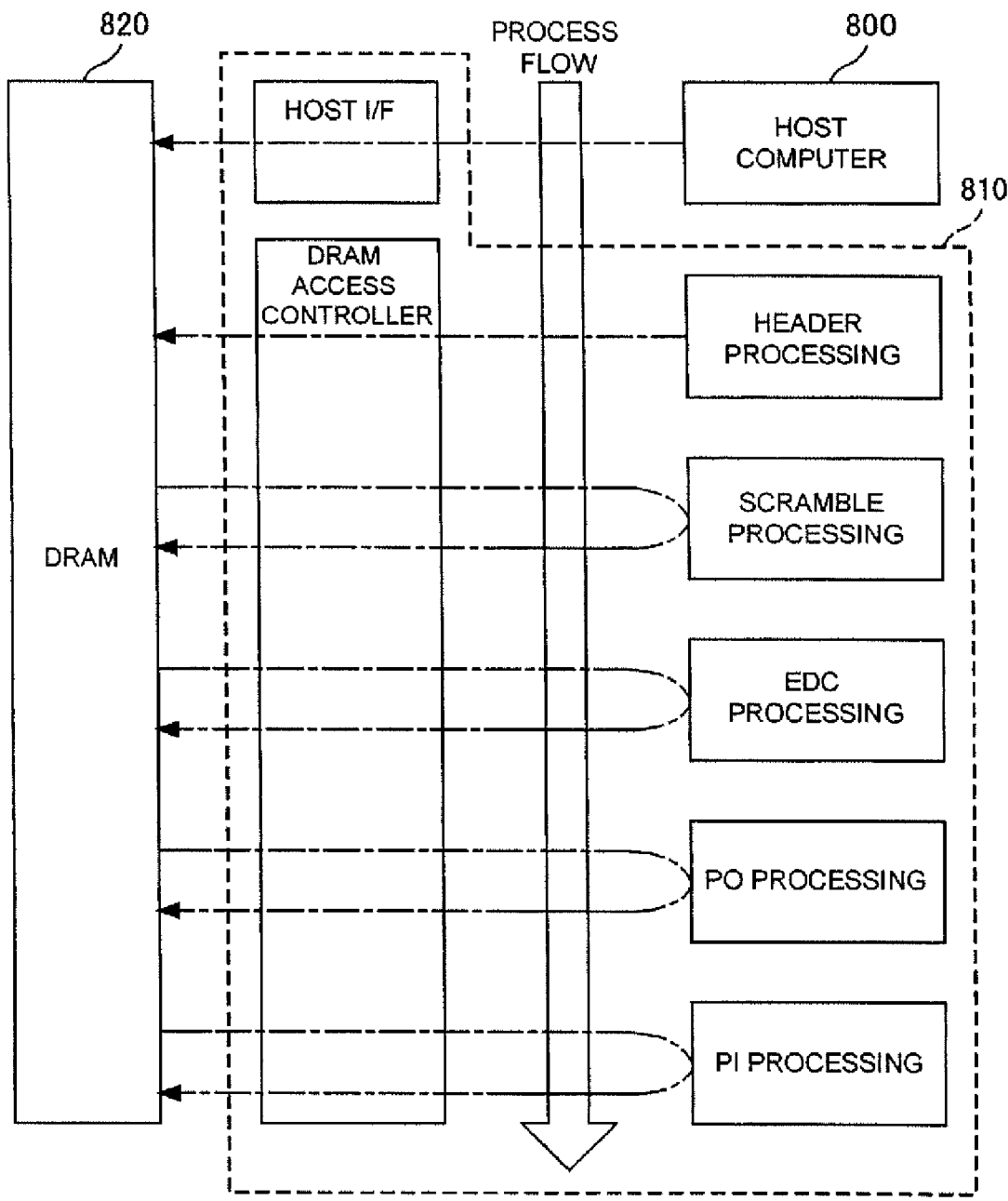
FIG. 14 is a view for explaining the conventional encoding process.

The flow of the encoding process using SRAMs 350 will be described based on FIG. 10. In the process example of FIG. 10, two SRAMs 350 are provided, but without a SRAM 340.

Hereinafter, the time period when the encoding process is performed on the i'th row (i=0 to 191) of a data sector group is called the i'th cycle, a data group constituting the i'th row of the data sector group is called the i'th row data, and the results of performing the encoding process on the i'th data are called the i'th row processed data. Unless otherwise stated, digital signal processing circuit 200 controls the operation.

First, in the i−1'th cycle, the i−1'th row processed data, the results of performing the encoding process on the i−1'th data, is stored sequentially into one SRAM 350.

Then, in the i'th cycle, the i−1'th row processed data stored in the one SRAM 350 is read out and written into DRAM 400. In parallel with the writing of the i−1'th row processed data into DRAM 400, the encoding process is performed on the i'th row data. And the i'th row processed data, the results of performing the encoding process on the i'th data, is written sequentially into the other SRAM 350. Then, in the i+1'th cycle and later, the above process is repeated until the encoding process for the 191st row of the data sector group finishes.

As described above, by providing a plurality of SRAMs 350, in parallel with the encoding process for data of any row of the data sector group, data of the preceding row of the data sector group is written into DRAM 400. Hence, without waiting for the performing results to be written into DRAM 400, the scramble process, EDC process, PO process, and PI process of the encoding process can start to be performed. Thus, the encoding process can be further speeded up.

Although either SRAMs 340 or SRAMs 350 may be provided, combination of SRAMs 340 and SRAMs 350 as shown in FIG. 8 can further speed up the encoding process over the case where either SRAMs 340 or SRAMs 350 is provided.

Although the preferred embodiment of the present invention has been described in detail, the above embodiment is provided to facilitate the understanding of the present invention and not intended to limit the present invention. It should be understood that various changes, substitutions and alterations can be made therein without departing from spirit and scope of the invention and that the present invention includes its equivalents.

What is claimed is:

1. An encoding apparatus for appending a first error correction code and a second error correction code for record data to be recorded on an optical disk, comprising:
    an error detection code generator that produces error detection codes for the record data;
    a scrambling section that scrambles a block unit of data constituted by forming sector units of data from the record data and arranging a plurality of sector units of data to form a matrix;
    a first error correction code generator that produces the first error correction codes for each of first data groups constituting the rows of the block unit of data;
    a second error correction code generator that produces the second error correction codes for each of second data groups constituting the columns of the block unit of data; and
    an encoding controller that controls at least two of the processes in the error detection code generator, the scrambling section, the first error correction code generator, and the second error correction code generator to be performed in parallel, controls the error detection code generator to perform an operation on the record data read out from the memory device to produce the error detection codes, while the scrambling section performs an operation on the read-out record data to scramble the record data, and controls the second error correction code generator to perform a second operation on the scrambled record data to produce the second error correction codes, while the first error correction code generator performs a first operation on the scrambled record data to produce the first error correction codes.

2. The encoding apparatus according to claim 1, further comprising:
    a first selector that selects either the error detection codes or the scrambled record data and supplies to the second error correction code generator;
    a second selector that selects either the error detection codes or the scrambled record data or the second error correction codes produced by the second operation and supplies to the first error correction code generator; and
    a third selector that selects either the error detection codes or the scrambled record data or the second error correction codes produced by the second operation or the first error correction codes produced by the first operation so as to write as results of performing the processes in parallel into the memory device,
    wherein the encoding controller sets selection timings in the first, second, and third selectors such that at lease two of the error detection code generator, the scrambling section, the first error correction code generator, and the second error correction code generator perform the processes in parallel.

3. The encoding apparatus according to claim 2, wherein the encoding controller controls the third selector to select the scrambled record data of the block unit of data and the first error correction codes produced from the scrambled record data and subsequently the second error correction codes produced from the scrambled record data of the block unit of data.

4. The encoding apparatus according to claim 2, wherein after the second error correction codes are produced from the scrambled record data of the block unit of data, the encoding controller controls the second selector to select the second error correction codes produced, and in turn controls the first error correction code generator to perform the first operation on the second error correction codes supplied, to produce first error correction codes.

5. The encoding apparatus according to claim 1, further comprising:
    a selector that selects either the error detection codes or the scrambled record data or the first error correction codes produced by the first operation,
    wherein after the first error correction codes are produced from the scrambled record data of the block unit of data, the encoding controller controls the selector to select the first error correction codes produced, and in turn controls the second error correction code generator to perform the second operation on the first error correction codes supplied, to produce second error correction codes.

6. The encoding apparatus according to claim 1, wherein a plurality of buffer memory devices to temporarily store record data of a predetermined data size read out from the memory device are provided between the memory device, and the error detection code generator and the scrambling section, and
    wherein after temporarily storing record data of the predetermined data size read out from the memory device in one of the buffer memory devices, the encoding controller transfers the record data of the predetermined data size to the error detection code generator and the scrambling section, and temporarily stores next record data of the predetermined data size read out from the memory device in another of the buffer memory devices.

7. The encoding apparatus according to claim 1, further comprising:

a third selector that selects either the error detection codes or the scrambled record data or the second error correction codes produced by the second operation or the first error correction codes produced by the first operation so as to write as results of performing the processes in parallel into the memory device, wherein a plurality of buffer memory devices to temporarily store results of performing the processes in parallel on record data of a predetermined data size read out from the memory device are provided between the third selector and the memory device, and wherein after temporarily storing results of performing the processes in parallel on record data of the predetermined data size in one of the buffer memory devices, the encoding controller writes the results of performing the processes in parallel into the memory device, and temporarily stores results of performing the processes in parallel on next record data of the predetermined data size in another of the buffer memory devices.

8. The encoding apparatus according to claim 7, wherein the buffer memory device is a SRAM (Static Random Access Memory).

9. The encoding apparatus according to claim 1, wherein the memory device is a DRAM (Dynamic Random Access Memory).

* * * * *

UNITED STATES PATENT AND TRADEMARK OFFICE
CERTIFICATE OF CORRECTION

| | |
|---|---|
| PATENT NO. | : 7,475,324 B2 |
| APPLICATION NO. | : 11/080673 |
| DATED | : January 6, 2009 |
| INVENTOR(S) | : Hiroki Nagai |

Page 1 of 1

It is certified that error appears in the above-identified patent and that said Letters Patent is hereby corrected as shown below:

Claim 2, line 17, delete "lease" and insert --least--.

Signed and Sealed this

Twenty-eighth Day of July, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,475,324 B2  
APPLICATION NO. : 11/080673  
DATED : January 6, 2009  
INVENTOR(S) : Hiroki Nagai Page 1 of 1

It is certified that error appears in the above-identified patent and that said Letters Patent is hereby corrected as shown below:

Column 12, Claim 2, line 17, delete "lease" and insert --least--.

This certificate supersedes the Certificate of Correction issued July 28, 2009.

Signed and Sealed this

Eighteenth Day of August, 2009

David J. Kappos  
*Director of the United States Patent and Trademark Office*